(12) United States Patent
Ayel

(10) Patent No.: US 11,417,690 B2
(45) Date of Patent: Aug. 16, 2022

(54) IMAGE SENSOR WITH INCREASED DYNAMIC RANGE

(71) Applicant: Commissariat à l'Énergie Atomique et aux Énergies Alternatives, Paris (FR)

(72) Inventor: François Ayel, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 17/019,075

(22) Filed: Sep. 11, 2020

(65) Prior Publication Data
US 2021/0082981 A1 Mar. 18, 2021

(30) Foreign Application Priority Data

Sep. 17, 2019 (FR) ...................................... 1910259

(51) Int. Cl.
H01L 27/146 (2006.01)
H04N 5/355 (2011.01)
H04N 5/378 (2011.01)

(52) U.S. Cl.
CPC .. H01L 27/14612 (2013.01); H01L 27/14643 (2013.01); H04N 5/3559 (2013.01); H04N 5/378 (2013.01)

(58) Field of Classification Search
CPC ........ H01L 27/14612; H01L 27/14643; H04N 5/3559; H04N 5/378; H04N 5/355
See application file for complete search history.

(56) References Cited

U.S. PATENT DOCUMENTS

| 8,189,082 | B2 | 5/2012 | Matsuura |
| 8,212,904 | B2 | 7/2012 | Ishimoto et al. |
| 8,284,280 | B2 | 10/2012 | Barbier et al. |
| 10,171,765 | B1* | 1/2019 | Ebihara ................ H04N 5/3742 |
| 10,205,903 | B2* | 2/2019 | Koifman ................ H04N 5/378 |
| 2007/0103574 | A1 | 5/2007 | Tanaka |
| 2009/0295968 | A1 | 12/2009 | Matsuda et al. |
| 2011/0043675 | A1* | 2/2011 | Matsuda ............ H04N 5/37452 348/300 |
| 2012/0132786 | A1* | 5/2012 | Mori .................... H04N 5/3742 250/208.1 |

(Continued)

OTHER PUBLICATIONS

FR1910259, Apr. 8, 2020, Preliminary Search Report.
Preliminary Search Report for French Application No. 1910259, dated Apr. 8, 2020.

*Primary Examiner* — Shahbaz Nazrul
(74) *Attorney, Agent, or Firm* — Wolf, Greenfield & Sacks, P.C.

(57) ABSTRACT

An image sensor including: a pixel circuit comprising a first transistor having one of its main conducting nodes connected to an output line, the other of its main conducting nodes coupled to a supply voltage rail via a read transistor, and its control node coupled to a sense node of the pixel circuit; a current source coupled to the output line; and a control circuit configured to read a pixel voltage from the pixel circuit by: activating the current source while the read transistor is non-conducting; and deactivating the current source and activating the read transistor of the pixel circuit in order to impose a boosted voltage at the sense node.

12 Claims, 5 Drawing Sheets

(56) References Cited

U.S. PATENT DOCUMENTS

| | | | |
|---|---|---|---|
| 2013/0032691 A1* | 2/2013 | Cho | H04N 5/3575 |
| | | | 250/206 |
| 2016/0037106 A1* | 2/2016 | Oh | H04N 5/332 |
| | | | 348/143 |
| 2020/0260035 A1* | 8/2020 | Luong | H01L 27/14641 |
| 2020/0396406 A1* | 12/2020 | Freson | H04N 5/378 |
| 2021/0067720 A1* | 3/2021 | Benjaram | H04N 5/378 |

* cited by examiner

IMAGE SENSOR WITH INCREASED DYNAMIC RANGE

CROSS REFERENCE TO RELATED APPLICATION

This application claims the priority benefit of French patent application number FR No 19/10259, filed Sep. 17, 2019, the content of which is hereby incorporated by reference in its entirety to the maximum extent allowable by law.

TECHNICAL FIELD

The present disclosure relates generally to the field of CMOS image sensors, and in particular to an image sensor and method of using an image sensor that provides an increased dynamic range.

BACKGROUND ART

CMOS image sensors are generally based on an array of pixels each comprising a photodetector, such as a photodiode, that transforms photons into electrons. In order to read the level of charge generated by the photodiode, the charge is transferred to a sense node of the pixel, and a buffer is generally used to copy the sense node voltage to an output line.

The dynamic range of each pixel is limited by the voltage range that can be read out by the buffer. For example, before transferring the charge to the sense node, the voltage level at the sense node is reset to a high reset voltage level, and the transfer of charge to the sense node then causes this voltage level to fall. However, only voltage levels above a certain minimum level can be read.

One way of increasing the dynamic range would be to increase the level of the reset voltage. However, such an increase is likely to increase energy consumption of the circuit, and may not be compatible with the transistor technology, leading to added complexity.

There is thus a need in the art for an image sensor and a method of using an image sensor that provides an increased dynamic range without significantly increasing the energy consumption of the circuit, or permitting the energy consumption to be reduced without reducing the dynamic range.

SUMMARY OF INVENTION

According to one aspect, there is provided an image sensor comprising: a pixel circuit comprising a first transistor having one of its main conducting nodes connected to an output line, the other of its main conducting nodes coupled to a supply voltage rail via a read transistor, and its control node coupled to a sense node of the pixel circuit; a current source coupled to the output line; and a control circuit configured to read a pixel voltage from the pixel circuit by: activating the current source while the read transistor is non-conducting; and deactivating the current source and activating the read transistor of the pixel circuit, for example while the current source remains deactivated, in order to impose a boosted voltage at the sense node.

According to one embodiment, after imposing the boosted voltage at the sense node, the control circuit is further configured to activate the current source and to transfer charge from a photodiode of the pixel circuit to the sense node.

According to one embodiment, the pixel circuit further comprises a transfer gate coupling the photodiode to the sense node, and the control circuit is configured to transfer the charge from the photodiode to the sense node of the pixel circuit by activating the transfer gate.

According to one embodiment, the control circuit is further configured to couple the sense node of the pixel circuit to a reset voltage rail prior to activating the read transistor.

According to one embodiment, the pixel circuit is part of an array of pixel circuits arranged in rows and columns, a plurality of the pixel circuits of a same column being coupled to the output line.

According to one embodiment, the current source comprises a second transistor forming a branch of a current mirror, and a third transistor configured to selectively prevent conduction of the second transistor in order to deactivate the current source.

According to one embodiment, the third transistor is coupled in series with the second transistor.

According to one embodiment, the third transistor is coupled between a control node of the second transistor and a further supply rail.

According to a further aspect, there is provided a method of reading a pixel voltage from a pixel circuit of an image sensor, the pixel circuit comprising a first transistor having one of its main conducting nodes connected to an output line, the other of its main conducting nodes coupled to a supply voltage rail via a read transistor, and its control node coupled to a sense node of the pixel circuit, the method comprising: activating a current source of the image sensor coupled to the output line while the read transistor is non-conducting; and deactivating the current source and activating the read transistor of the pixel circuit, for example while the current source remains deactivated, in order to impose a boosted voltage at the sense node.

According to one embodiment, the method further comprises, after imposing the boosted voltage at the sense node, activating the current source and transferring charge from a photodiode of the pixel circuit to the sense node.

According to one embodiment, the pixel circuit further comprises a transfer gate coupling the photodiode to the sense node, and the method further comprises transferring charge from the photodiode to the sense node of the pixel circuit by activating the transfer gate.

According to one embodiment, the method further comprises coupling the sense node of the pixel circuit to a reset voltage rail prior to activating the read transistor.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements. Unless indicated otherwise, when the term "coupled" is used, it should be understood that the connection in question would be capable of being implemented by a direct connection.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
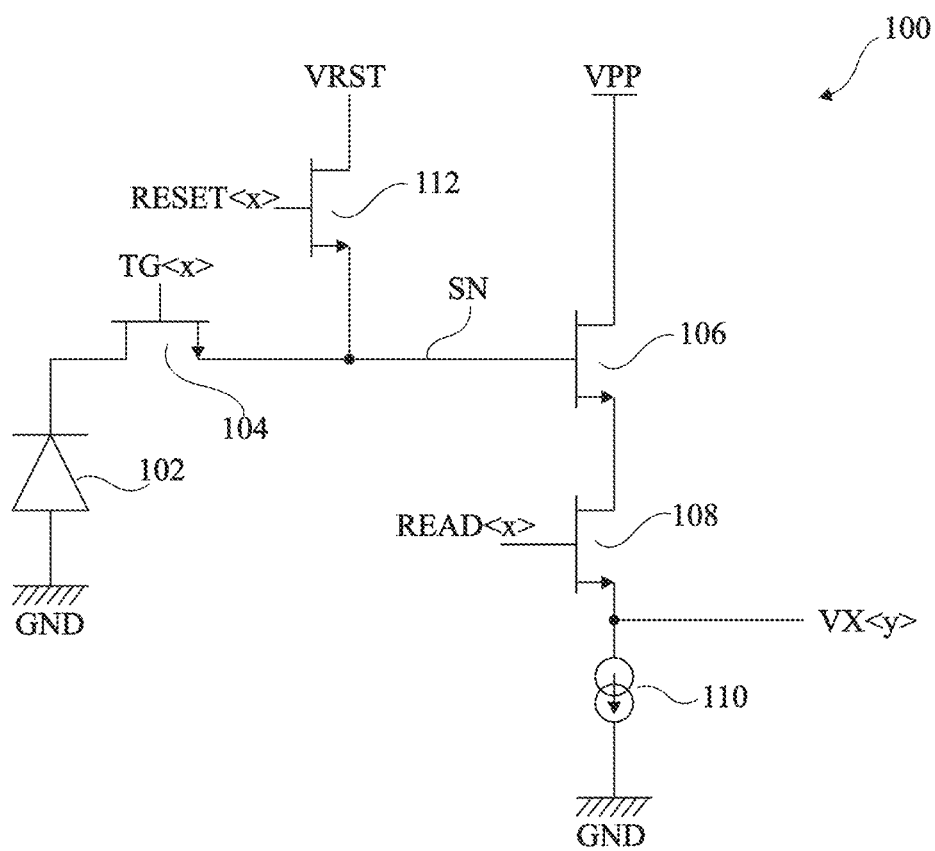
FIG. 1 schematically illustrates a pixel circuit that has been proposed.

FIG. 1 schematically illustrates a pixel circuit 100 that has been proposed. The pixel circuit 100 for example forms part of an array of pixel circuits arranged in rows and columns.

The pixel circuit 100 comprises a photodiode 102, which is for example a pinned photodiode, having its anode coupled to a ground rail GND and its cathode coupled to a sense node SN of the pixel circuit via a transfer gate 104. The transfer gate 104 is for example controlled at its control node by a control signal TG<x>, where "<x>" signifies that the signal is common for all the pixel circuits of a row of the array.

The sense node SN is further coupled to the control node of a source follower transistor 106, which has one of its main conducting nodes coupled to a supply rail VPP, and its other main conducting node coupled to an output line VX<y> via a read transistor 108, where "<y>" signifies that the signal is common for all the pixel circuits of a column of the array. The read transistor 108 is for example controlled at its control node by a control signal READ<x>.

The output line VX<y>, which will be referred to hereafter as a column line, is also for example coupled to the ground rail GND via a current source 110. While shown as part of the pixel circuit, generally such a current source 110 is positioned at the top or bottom of the array and is common for all pixels of the column.

The sense node SN is also for example coupled to a reset voltage supply rail VRST via a reset transistor 112 controlled at its control node by a control signal RESET<x>.

In some embodiments, the transfer gate 104 and transistors 106, 108 and 112 are all n-channel MOS (NMOS) devices, the sources of the devices 104 and 112 being connected to the sense node SN, the source of the device 106 being connected to the read transistor 108, and the source of the read transistor 108 being connected to the column line VX<y>.

During operation of the pixel circuit 100, charge that has been integrated on the photodiode 102 during an integration period is transferred to the sense node SN via the transfer gate 104, and then read out via the transistors 106 and 108. Indeed, the transistor 106 is arranged in a source follower configuration. This means that during the readout operation, this transistor 106 operates like a buffer, the voltage at its gate being copied to its source, minus the Vgs voltage of the transistor 106. There will, however, be a limit to the voltage range that can be readout by the transistors, as will now be described in more detail with reference to FIG. 2.

Figure 2:
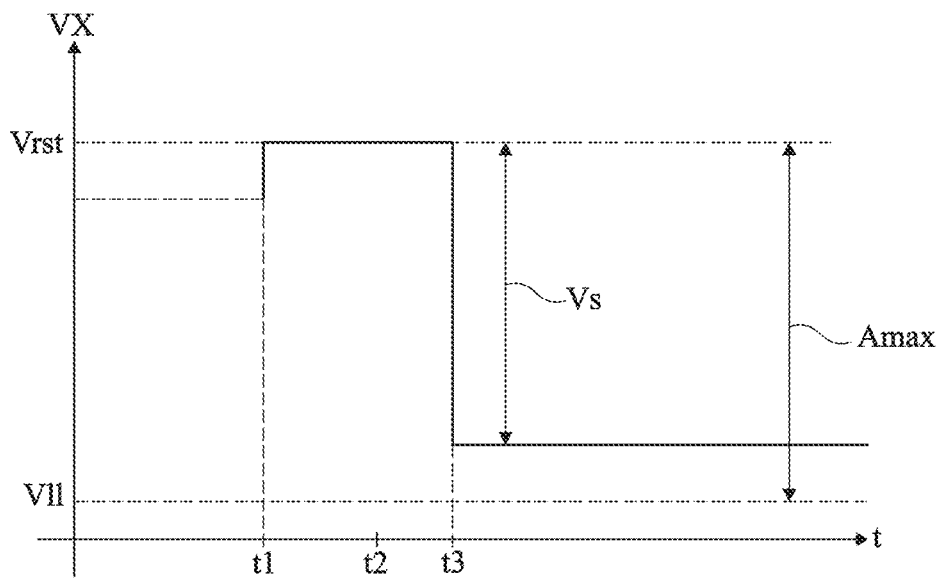
FIG. 2 is a graph representing a dynamic range of the pixel circuit of FIG. 1.

FIG. 2 is a timing diagram representing an example of the voltage VX on the column line VX<y>, and represents a dynamic range of the pixel circuit 100 of FIG. 1.

Initially, it is assumed that the read transistor 108 of the pixel circuit 100 to be read is activated, and the voltage at the sense node SN is floating, this voltage being copied to the column line VX.

At a time t1, the sense node voltage is reset by activating the reset transistor 112, and thus the column line voltage VX rises to a reset level Vrst, which is for example relatively close to the voltage level VRST.

At a time t2, the reset transistor 112 is deactivated, leaving the sense node voltage floating again.

At a time t3, the transfer gate 104 is activated, and accumulated charge is transferred to the sense node SN, causing the sense node voltage to drop, and causing a corresponding drop Vs on the column line VX, this drop Vs representing the signal captured by the pixel. However, the column line VX has a low operating limit, labelled Vll in FIG. 2, below which a read operation cannot correctly occur. The voltage Vll for example corresponds to the minimum voltage drop across the current source 110 in order for this current source to function correctly. Thus, the amplitude of the signal Vs should be equal to or lower than a maximum amplitude Amax, corresponding to the voltage difference between the voltages Vrst and Vll. This maximum amplitude Amax thus represents a limit of the dynamic range of the pixel.

As explained above, one manner in which the dynamic range could be increased would be to increase the level of the reset voltage on the VRST voltage rail. However, this would increase the energy consumption of the array, and may not be compatible with the transistor technology. A solution for increasing the dynamic range with respect to the example of FIGS. 1 and 2 will now be described with reference to FIGS. 3 to 10.

Figure 3:
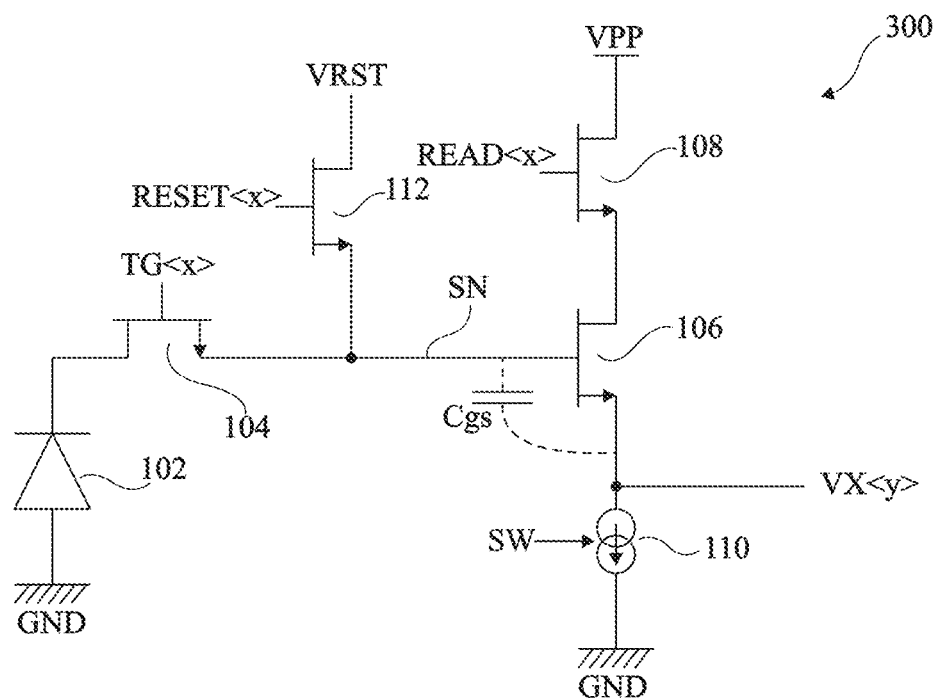
FIG. 3 schematically illustrates a pixel circuit according to an example embodiment of the present disclosure.

FIG. 3 schematically illustrates a pixel circuit 300 according to an example embodiment of the present disclosure. The pixel circuit 300 is for example very similar to the pixel circuit 100 of FIG. 1, and like elements have been labelled with like reference numerals and will not be described again in detail. However, a difference is that, in the pixel circuit 300, the read transistor 108 has been moved from being coupled between the source of the transistor 106 and the column line VX<y> to being coupled between the drain of the transistor 106 and the supply voltage rail VPP. This configuration has the advantage of rendering the source follower transistor 106 directly accessible from the column line VX<y>. Another difference is that the current source 110 receives a control signal SW allowing it to be selectively activated.

A method of operating the pixel circuit 300 of FIG. 3 in order to increase its dynamic range will now be described in more detail with reference to FIG. 4.

Figure 4:
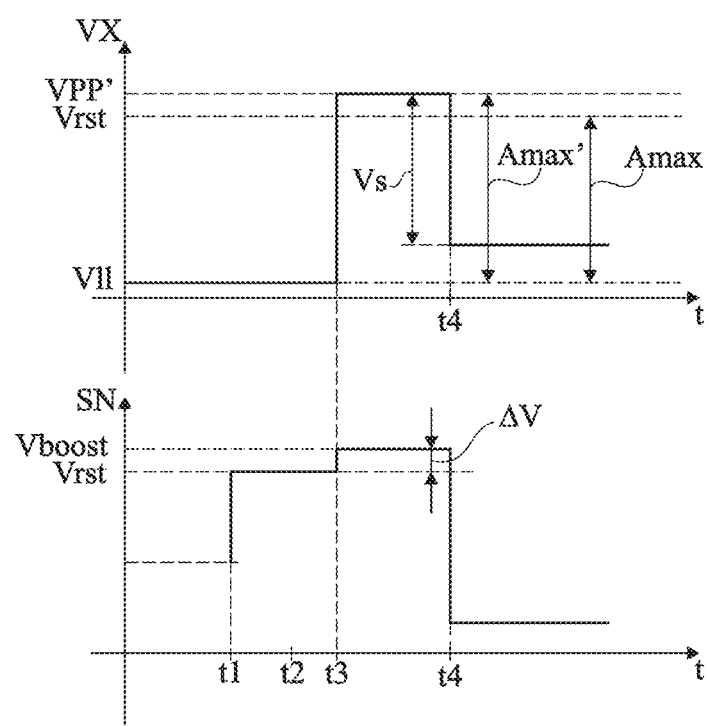
FIG. 4 is a graph representing a readout range of the pixel of FIG. 3.

FIG. 4 is a timing diagram representing an example of the column voltage VX and source node voltage SN in the pixel circuit 300 during a read operation according to an example embodiment of the present disclosure. In FIG. 4, for the purpose of comparison, the voltage level Vrst of FIG. 2 is shown again in relation with the column voltage VX.

Initially, the transfer gate 104 and transistors 108 and 112 are non-conducting, and the current source 110 is conducting. Thus, the voltage VX of the column line VX<y> is pulled down to the low level Vll and the voltage SN at the sense node is floating. In some embodiments, the low voltage limit Vll is in the range 0.2 to 0.7 V.

At a time t1, the reset transistor 112 is for example activated, and the sense node voltage SN thus rises to the voltage level Vrst close to the reset voltage level VRST on the voltage rail VRST. This for example results in a voltage of substantially Vrst-Vll, in other words the reset voltage level VRST minus the low level Vll, being stored across the gate-source parasitic capacitance Cgs of the source-follower transistor 106. In some embodiments, the voltage Vrst is in the range 1 to 2 V, or higher, and is for example chosen to be the highest voltage permitted by the transistor technology.

At a time t2, the reset transistor 112 is for example deactivated again, rendering the sense node SN floating. Also at time t2, the current source 110 is for example deactivated, although this deactivation could occur at another time before or shortly after a time t3.

At the time t3, the read transistor 108 is activated. In view of the deactivated state of the current source 110, this causes the column line voltage VX to rise to a level VPP' close to the supply voltage level VPP. In some embodiments, the voltage level VPP is in the range 2 to 4 V, and for example at around 3.3 V, and is for example chosen to be as low as possible. The voltage VPP' corresponds to SN-Vgs, in other words to the voltage SN minus the gate source voltage Vgs of transistor 106. Furthermore, in view of the voltage stored across the parasitic capacitance Cgs, the sense node SN will rise by an additional voltage □V to a boosted level Vboost higher than the reset level Vrst. Thus, when the transfer gate 104 is activated at a time t4, the available amplitude is increased from the amplitude Amax of the example of FIG. 2 to an amplitude Amax' corresponding to the difference between the voltage VPP' and the lower limit Vll. In some embodiments, the voltage difference □V is equal to at least 0.1 V, and is for example equal to 1 V or more in some embodiments.

The method of reading a pixel voltage based on the operation represented in FIG. 4 will now be described in more detail with reference to FIGS. 5 and 6.

Figure 5:
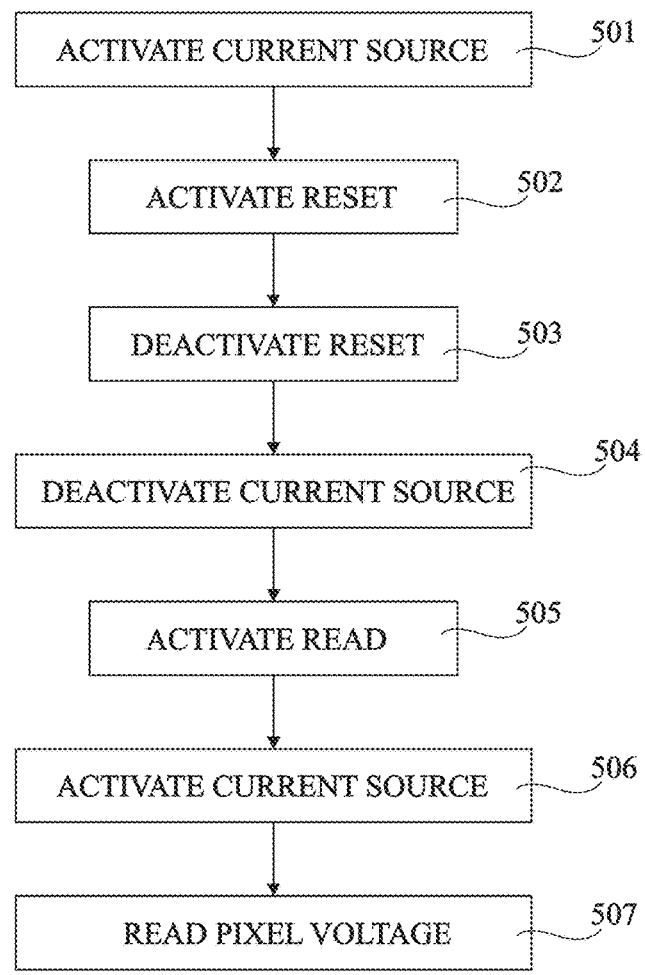
FIG. 5 is a flow diagram representing operations in a method of reading a pixel voltage according to an example embodiment of the present disclosure.

FIG. 5 is a flow diagram representing operations in a method of reading a pixel voltage according to an example embodiment of the present disclosure.

Figure 6:
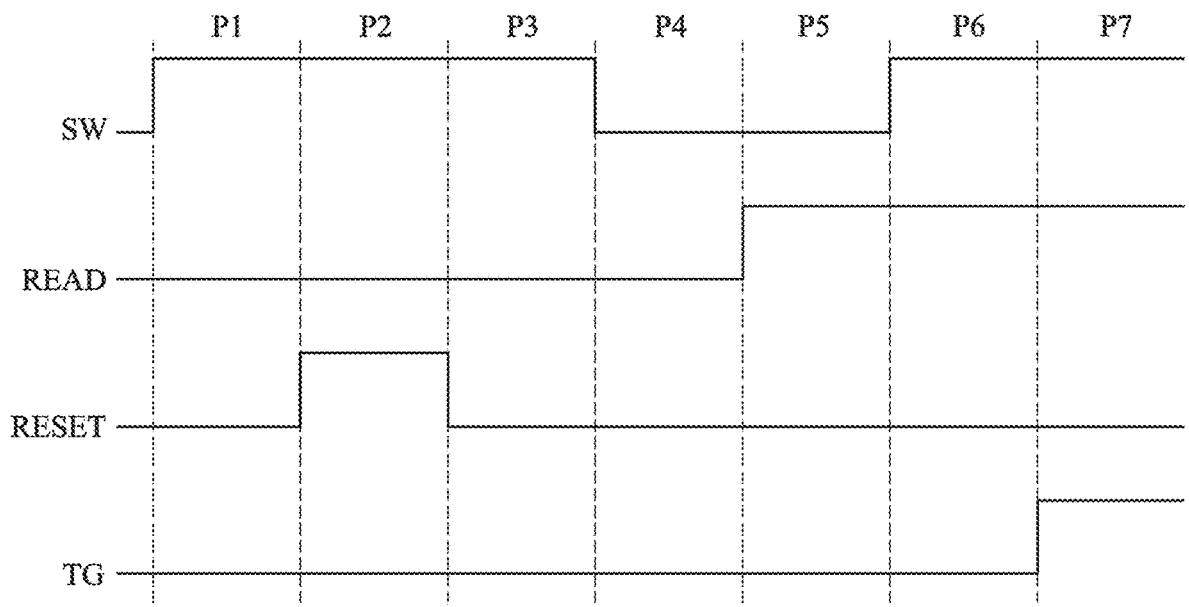
FIG. 6 is a timing diagram representing signals in the pixel circuit of FIG. 3 according to an example embodiment.

FIG. 6 is a timing diagram representing signals in the pixel circuit of FIG. 3 according to an example embodiment, and in particular the signals SW, READ, RESET and TG. In the example of FIG. 6, the timing of the switching of these signals has been represented in seven distinct phases P1 to P7. However, this is merely one example, and alternative timing of the signal transitions would be possible, including the transition of some signals at the same time.

As shown in FIG. 6, the read sequence for example starts with the signals SW, READ, RESET and TG all low, implying that the current source 110 is deactivated and the transistors 108, 112 and transfer gate 104 are non-conducting.

In an operation 501 of FIG. 5, the current source 110 is activated. Thus, during the phase P1 in FIG. 6, the current source 110 is active while the read transistor 108 is not activated, causing the column line voltage VX to fall to the low level Vll.

In an operation 502, the reset transistor 112 is activated to reset the voltage at the sense node SN. Thus, during the phase P2 in FIG. 6, the signal RESET goes high. This corresponds to the time t1 of FIG. 4, at which the sense node SN voltage rises to the level Vrst.

In an operation 503, the reset transistor 112 is deactivated again, as shown during the phase P3 in FIG. 6. In some embodiments, the reset level at the source node is then read via the column line VX<y>, in the case that this voltage is to be read without a voltage boost.

In an operation 504, the current source 110 is then for example deactivated, as shown during the phase P4 in FIG. 6. This corresponds to the time t2 in FIG. 4. In some embodiments, the deactivation of the reset transistor 112 and of the current source 110 could occur at the same time.

In an operation 505, the read transistor 108 is activated while the current source remains deactivated, as shown during the phase P5 in FIG. 6. This corresponds to the time t3 in FIG. 4, and results in imposing the voltage Vboost at the sense node SN.

In an operation 506, the current source 110 is activated again, as shown during a phase P6 in FIG. 6. The current source 110 can be deactivated, for example during the phases P4 and P5, for a relatively short period of time, for example for between 1 and 10 µs.

Figure 7:
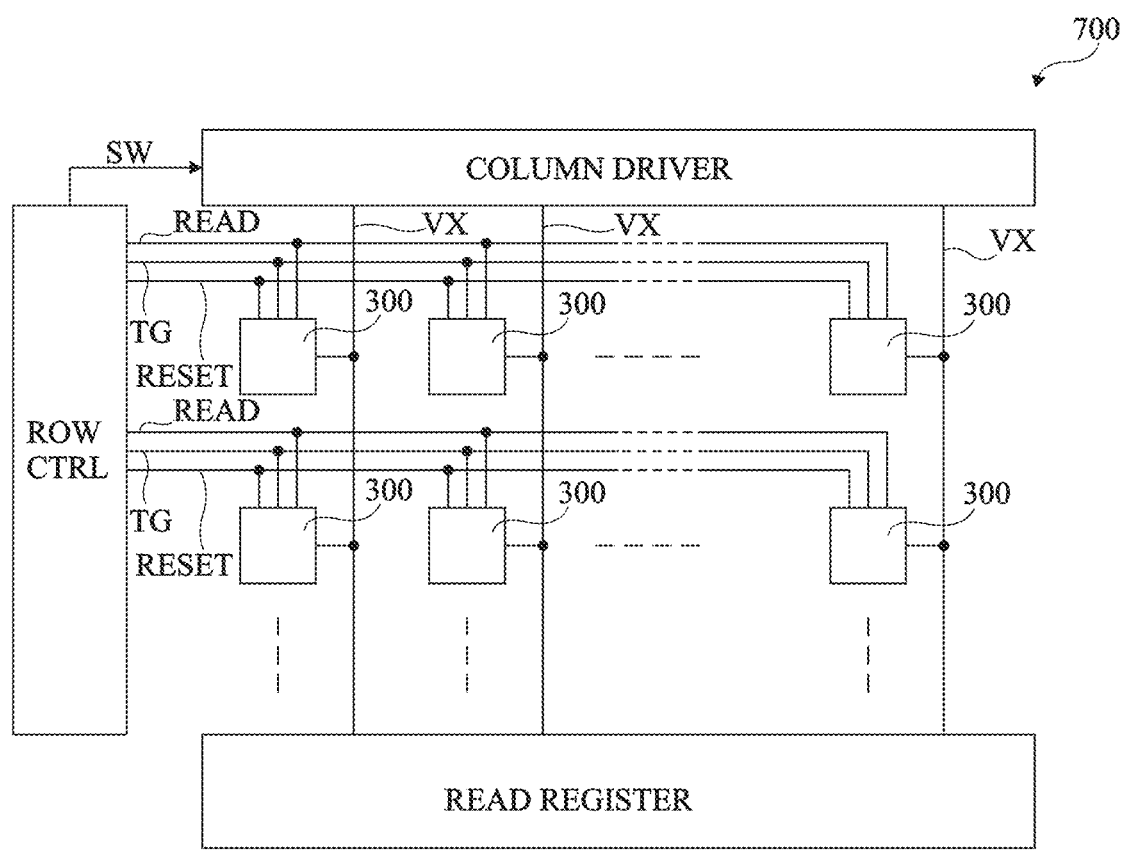
FIG. 7 schematically illustrates an image sensor according to an example embodiment of the present disclosure.

In an operation 507, the pixel voltage is then read by asserting the signal TG to activate the transfer gate 104, as shown during a phase P7 in FIG. 7. This corresponds to the time t4 in FIG. 4. In some embodiments, the activation of the current source 110 and of the transfer gate 104 could occur at the same time. During the operation 507, a read operation can for example be performed on the column line VX<y>, as will be described in more detail below with reference to FIG. 7.

FIG. 7 schematically illustrates an image sensor 700 according to an example embodiment of the present disclosure. The image sensor 700 comprises an array of the pixel circuits 300 of FIG. 3, arranged in rows and columns. The pixel circuits in each row for example receive corresponding common READ, TG and RESET control signals. These signals are for example generated by a row control circuit (ROW CTRL). The pixel circuits of each column are for example coupled to a corresponding common column line VX. The column lines VX are for example supplied by a column driver (COLUMN DRIVER). The row control circuit ROW CTRL also for example supplies the control signal SW to the current sources 110 of each column, which are for example implemented in the column driver. The column lines VX are also for example coupled to a read register (READ REGISTER), which for example temporarily stores to capacitors the voltages present on the columns lines, for example using sample and hold circuits, and then converts the voltages into digital values, using for example ramp converters.

While not illustrated in FIG. 7, each of the pixel circuits is also for example supplied with the supply voltages VRST and VPP and the ground supply voltage GND via corresponding voltage rails.

The operations of the method of FIG. 5 are for example implemented by the row control circuit ROW CTRL of FIG. 7. In some embodiments, the array 700 operates in a rolling shutter mode in which rows of pixel circuits are read one at a time in sequence, as well known by those skilled in the art.

Figure 8:
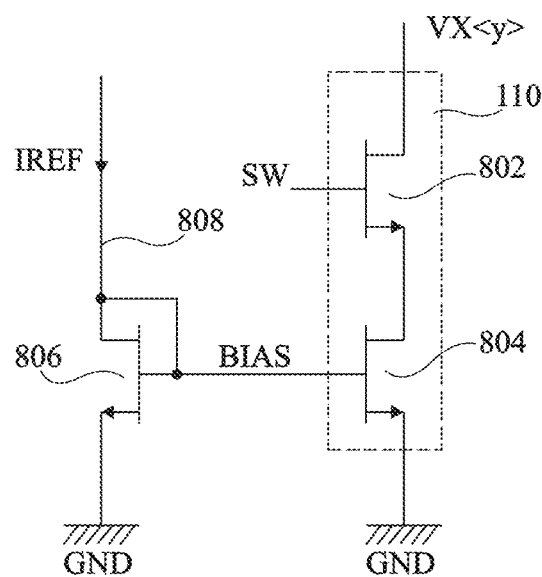
FIG. 8 schematically illustrates a current source of the pixel circuit of FIG. 3 according to an example embodiment.

FIG. 8 schematically illustrates the current source 110 of the pixel circuit 300 of FIG. 3 according to an example embodiment.

In the example of FIG. 8, the current source 110 comprises the series connection of transistors 802 and 804 between the column line VX<y> and the ground rail GND. The transistors 802 and 804 are for example NMOS transistors. The control node of the transistor 804 for example forms one branch of a current mirror. The other branch, which is the reference branch, for example comprises a transistor 806 coupled between an input line 808 and the ground rail GND, the control node of the transistor 806 being coupled to the control node of the transistor 804 and the input line 808. The input line 808 receives a reference current IREF generated for example by a further current source (not illustrated), which may be a constant current source that is relatively immune to PVT (process, voltage, temperature) variations.

In operation, when the control signal SW is asserted, in other words at a high level in the example of FIG. 8, the reference current IREF, or a current proportional thereto based on the relative sizes of the transistors 804 and 806, is selectively conducted on the column line VX<y>. However, when the control signal SW is not asserted, no current is conducted on the column line VX<y>.

Figure 9:
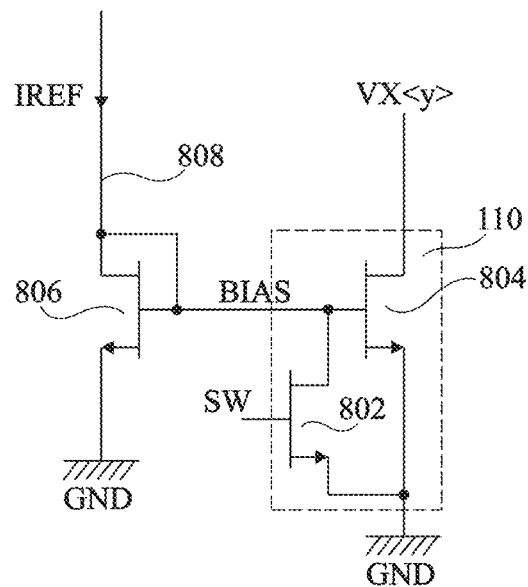
FIG. 9 schematically illustrates a current source of the pixel circuit of FIG. 3 according to a further example embodiment.

FIG. 9 schematically illustrates the current source 110 according to an alternative embodiment to that of FIG. 8. The example of FIG. 9 is similar to that of FIG. 8, except that the transistor 802 is no longer coupled in series with the transistor 804, but instead couples the control node of the transistor 804 to the ground rail GND. Thus, the operation of the embodiment of FIG. 9 is similar to that of FIG. 8.

Of course, FIGS. 8 and 9 provide just two examples of how the current source 110 could be implemented, there being many alternative implementations.

Figure 10:
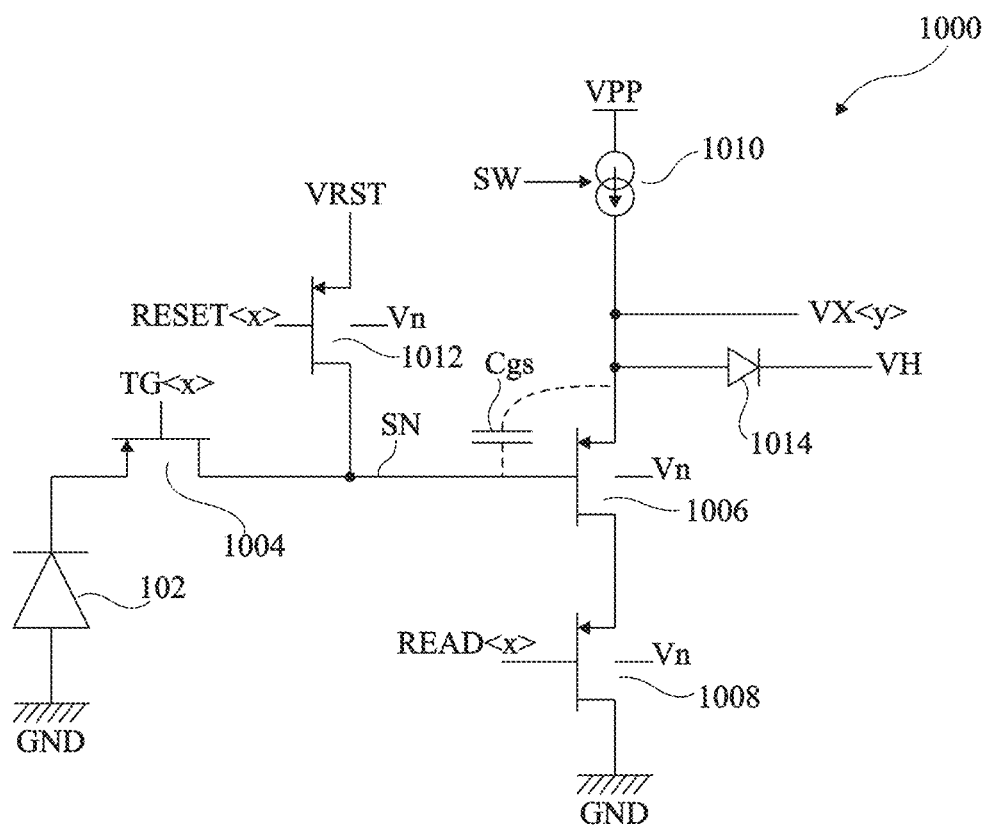
FIG. 10 schematically illustrates a pixel circuit according to a further example embodiment of the present disclosure.

FIG. 10 schematically illustrates a pixel circuit 1000 according to a further example embodiment of the present disclosure. The circuit 1000 of FIG. 10 is similar to the circuit 300 of FIG. 3, except that, in FIG. 10, the NMOS transfer gate 104 and NMOS transistors 106, 108 and 112 are respectively replaced by a p-channel MOS (PMOS) transfer gate 1004, and PMOS transistors 1006, 1008 and 1012. The transistors 1006, 1008 and 1012 each for example has its bulk node biased at a voltage Vn, which is for example a positive voltage that is lower than the voltage level VPP. The current source 110 is also for example replaced by a PMOS implementation 110 in which the transistors 802, 804 and 806 of FIG. 8 or 9 are replaced by PMOS transistors coupled to a positive supply voltage rail rather than to the ground supply voltage rail. Thus, in the example of FIG. 10, the corresponding control signals TG<x>, READ<x>, RESET<x> and SW are for example asserted when at a low level of for example 0 V.

In some embodiments, in the example of FIG. 10, the voltage VX on the column line VX<y> is prevented from exceeding a level VH by a diode 1014 having its anode coupled to the column line VX<y>, and its cathode coupled to a voltage rail at the voltage level VH. In alternative embodiments, the diode 1014 could be replaced by another device having a similar function to a diode, such as a diode-connected PMOS transistor. The voltage level VH is for example equal to or lower than the biasing voltage Vn.

The pixel circuit 1000 of FIG. 10 could be used to implement the pixel circuits of the array of FIG. 7 instead of the pixel circuits 300.

An advantage of the embodiments described herein is that the dynamic range of a pixel circuit can be increased with relatively little increase in energy consumption and/or the supply voltages of the pixel circuit can be reduced, thereby reducing energy consumption, without reducing the dynamic range.

Various embodiments and variants have been described. Those skilled in the art will understand that certain features of these embodiments can be combined and other variants will readily occur to those skilled in the art. For example, while embodiments have been described with control lines that are common to rows of pixels of a pixel array, and output lines that are common to columns of pixels of the pixel array, the inverse could be true, and the rows and columns could be formed in any direction.

Furthermore, it will be apparent to those skilled in the art that while circuits implemented using MOS transistor technology have been described, in alternative implementations other transistor technologies could be used. Furthermore, one or more of the NMOS transistors in the various circuits could be implemented by PMOS transistors in alternative embodiments, and/or one or more of the PMOS transistors in the various embodiments could be implemented by NMOS transistors.

It will also be apparent to those skilled in the art that the ground voltage supply rail in the various embodiments could be replaced by a voltage supply rail at any low supply voltage level, which could be negative, and which is for example lower than the positive supply levels VRST and VPP.

Finally, the practical implementation of the embodiments and variants described herein is within the capabilities of those skilled in the art based on the functional description provided hereinabove. For example, it will be apparent to those skilled in the art how the row control circuit ROW CTRL of FIG. 7 can be implemented using a state machine, and/or using combinational and/or sequential logic, or in order to generate an appropriate timing of the various control signals, for example the timing represented in FIG. 6.

The invention claimed is:

1. An image sensor comprising:
   a pixel circuit comprising a first transistor having one of its main conducting nodes connected to an output line, the other of its main conducting nodes coupled to a supply voltage rail via a read transistor, and its control node coupled to a sense node of the pixel circuit;
   a current source coupled to the output line and configured to impose a current on the output line; and
   a control circuit configured to read a pixel voltage from the pixel circuit by:
   activating the current source while the read transistor is non-conducting; and
   deactivating the current source and activating the read transistor over a period during which the current source remains deactivated in order to impose a boosted voltage at the sense node.

2. The image sensor of claim 1, wherein, after imposing the boosted voltage at the sense node, the control circuit is further configured to activate the current source and to transfer charge from a photodiode of the pixel circuit to the sense node.

3. The image sensor of claim 2, wherein the pixel circuit further comprises a transfer gate coupling the photodiode to the sense node, and the control circuit is configured to transfer the charge from the photodiode to the sense node of the pixel circuit by activating the transfer gate.

4. The image sensor of claim 1, wherein the control circuit is further configured to couple the sense node of the pixel circuit to a reset voltage rail prior to activating the read transistor.

5. The image sensor of claim 1, wherein the pixel circuit is part of an array of pixel circuits arranged in rows and columns, a plurality of the pixel circuits of a same column being coupled to said output line.

6. The image sensor of claim 1, wherein the current source comprises a second transistor forming a branch of a current mirror, and a third transistor configured to selectively prevent conduction of the second transistor in order to deactivate the current source.

7. The image sensor of claim 6, wherein the third transistor is coupled in series with the second transistor.

8. The image sensor of claim 6, wherein the third transistor is coupled between a control node of the second transistor and a further supply rail.

9. A method of reading a pixel voltage from a pixel circuit of an image sensor, the pixel circuit comprising a first transistor having one of its main conducting nodes connected to an output line, the other of its main conducting nodes coupled to a supply voltage rail via a read transistor, and its control node coupled to a sense node of the pixel circuit, the method comprising:
  activating a current source of the image sensor coupled to the output line and configured to impose a current on the output line while the read transistor is non-conducting; and
  deactivating the current source and activating the read transistor over a period during which the current source remains deactivated in order to impose a boosted voltage at the sense node.

10. The method of claim 9, further comprising, after imposing the boosted voltage at the sense node, activating the current source and transferring charge from a photodiode of the pixel circuit to the sense node.

11. The method of claim 10, wherein the pixel circuit further comprises a transfer gate coupling the photodiode to the sense node, the method further comprising transferring charge from the photodiode to the sense node of the pixel circuit by activating the transfer gate.

12. The method of claim 9, further comprising coupling the sense node of the pixel circuit to a reset voltage rail prior to activating the read transistor.

\* \* \* \* \*